United States Patent
Burgess et al.

(10) Patent No.: US 10,411,705 B1
(45) Date of Patent: Sep. 10, 2019

(54) SYSTEM, METHOD AND APPARATUS FOR ELECTRONIC CIRCUIT

(71) Applicant: Arm Limited, Cambridge (GB)

(72) Inventors: Neil Burgess, Cardiff (GB); Pranay Prabhat, Cambridge (GB)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/146,010

(22) Filed: Sep. 28, 2018

(51) Int. Cl.
*G11C 7/22* (2006.01)
*H03K 19/00* (2006.01)
*H03K 3/356* (2006.01)

(52) U.S. Cl.
CPC ......... *H03K 19/0016* (2013.01); *G11C 7/222* (2013.01); *H03K 3/356* (2013.01)

(58) Field of Classification Search
CPC ................................ H03K 3/356; G11C 7/222
USPC .......................................................... 326/93
See application file for complete search history.

(56) References Cited

U.S. PATENT DOCUMENTS

| | | | | |
|---|---|---|---|---|
| 6,728,865 B1* | 4/2004 | Coon | .................... | G06F 9/3816 711/201 |
| 7,149,878 B1* | 12/2006 | Jensen | ................ | G06F 9/30076 712/209 |
| 2003/0223427 A1* | 12/2003 | Chang | .................... | H04W 60/00 370/395.3 |
| 2005/0283589 A1* | 12/2005 | Matsuo | ................ | G06F 9/30101 712/217 |
| 2007/0124631 A1* | 5/2007 | Boggs | ................. | G06F 9/30032 714/724 |
| 2008/0010426 A1* | 1/2008 | Yamamoto | ............ | G06F 9/3012 711/163 |
| 2012/0265967 A1* | 10/2012 | Gschwind | ........... | G06F 9/30138 712/210 |
| 2014/0025927 A1* | 1/2014 | Bradbury | ............ | G06F 9/30014 712/204 |
| 2015/0126156 A1* | 5/2015 | Sauder | .................. | H04L 63/101 455/411 |
| 2017/0083316 A1* | 3/2017 | Burger | .................. | G06F 9/3004 |

* cited by examiner

*Primary Examiner* — Don P Le
(74) *Attorney, Agent, or Firm* — Leveque IP Law, P.C.

(57) ABSTRACT

Area-efficient logic circuitry for checkpointing a register file using a mapper in an "in-order" CPU (central processing unit). A pair of flops with a shared master stage latch circuit implement storage elements in a register file and a checkpointed copy of the same register file.

24 Claims, 4 Drawing Sheets

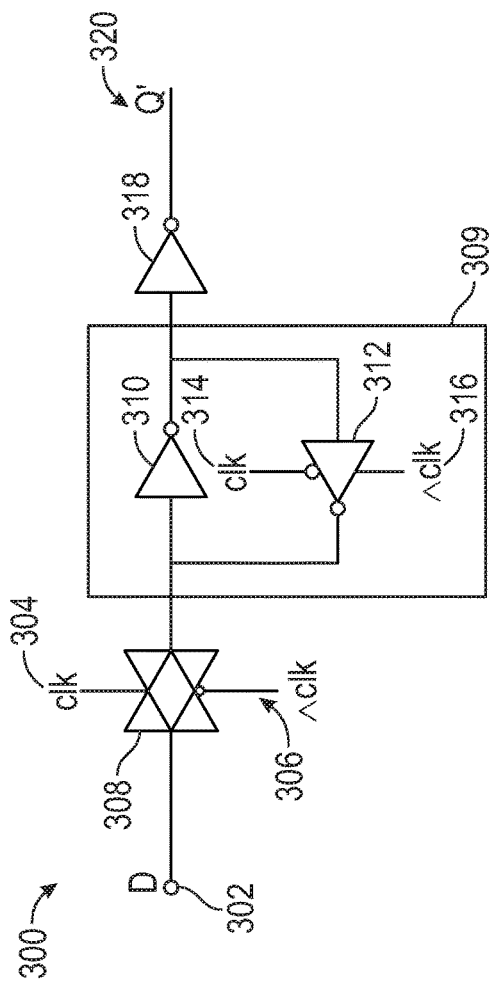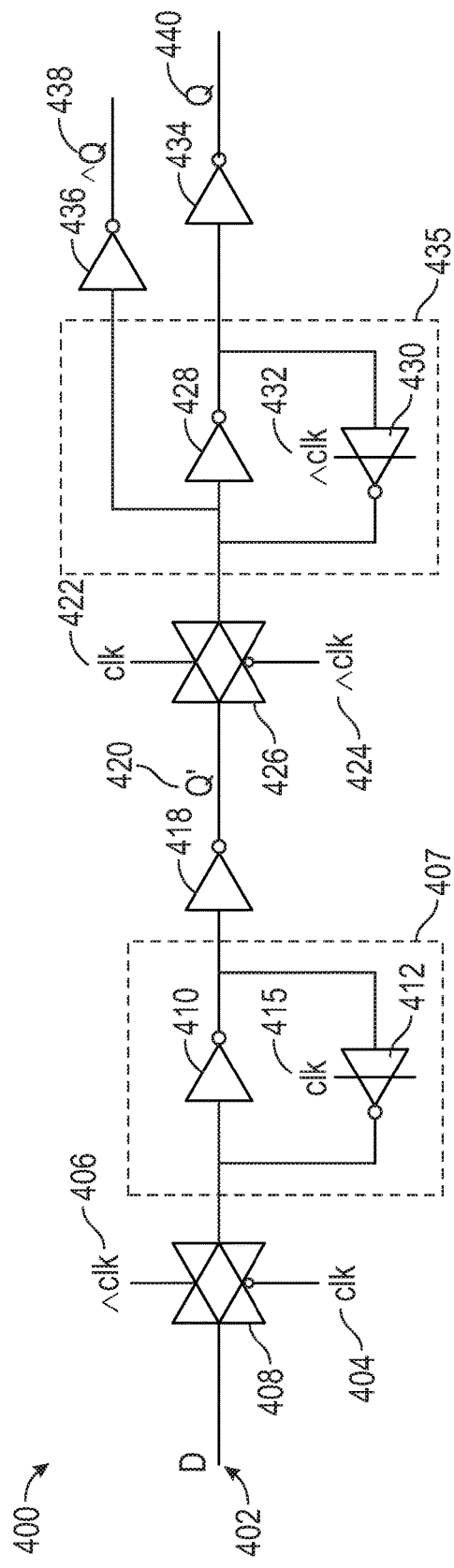

SYSTEM, METHOD AND APPARATUS FOR ELECTRONIC CIRCUIT

BACKGROUND

In many instances processing circuitry, for example, latch circuits, may be used to perform processing of instructions from a given program according to either "in-order" processing or "out-of-order" processing. In an "in-order" processor, the instructions of the program are executed in the same order in which they are defined in the program. In an "out-of-order" processor, if an older instruction in the program order is stalled but a younger instruction can execute because all of its operands are available, and it is independent of the stalled instruction, then the processor may execute the younger instruction first to avoid wasting cycles, and hence improve performance overall.

BRIEF DESCRIPTION OF THE DRAWINGS

The accompanying drawings provide visual representations, which will be used to more fully describe various representative embodiments and can be used by those skilled in the art to better understand the representative embodiments disclosed and their inherent advantages. In these drawings, like reference numerals identify corresponding elements.

FIG. 3 illustrates a latch circuit design.

FIG. 4 illustrates a flip flop circuit.

DETAILED DESCRIPTION

Figure 1:
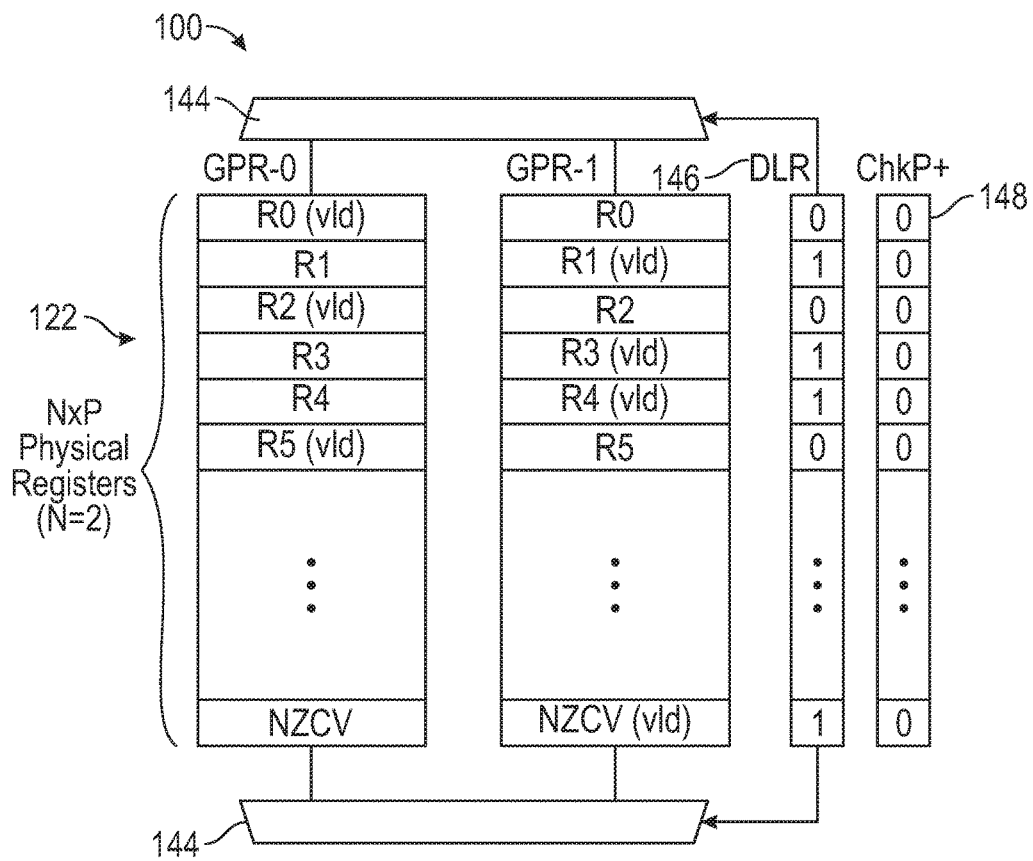
FIG. 1 illustrates a mapped register for checkpointing.

While this disclosure is susceptible of embodiment in many different forms, there is shown in the drawings and will herein be described in detail specific embodiments, with the understanding that the present disclosure is to be considered as an example of the principles described and not intended to limit the disclosure to the specific embodiments shown and described. In the description below, like reference numerals are used to describe the same, similar or corresponding parts in the several views of the drawings.

In this document, relational terms such as first and second, top and bottom, and the like may be used solely to distinguish one entity or action from another entity or action without necessarily requiring or implying any actual such relationship or order between such entities or actions. The terms "comprise", "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

Reference throughout this document to "one embodiment", "certain embodiments", "an embodiment" or similar terms means that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

A "module" as used herein describes a component or part of a program or device that can contain hardware or software, or a combination of hardware and software. In a module that includes software, the software may contain one or more routines, or subroutines. One or more modules can make up a program and/or device.

For purposes of improving reliability, high-performance applications may checkpoint data. The generation of a checkpoint typically involves storing data indicative of a memory image of an application process at a particular time. The checkpoint may be a full checkpoint, in which data indicative of entire memory image is stored or an incremental checkpoint, which represents the changes to the image after the last checkpoint.

Checkpoint mechanisms may be classified as being application transparent or application explicit. Transparent checkpoint mechanisms do not involve modification to the application program code; however, explicit checkpointing modifies the program code.

An embodiment of this disclosure relates to a single-master/dual-slave master-slave flop for fast checkpointing. This fast checkpointing may be, for example MORAY® checkpointing. (MORAY is a registered trademark of ARM®.) In general, checkpointing is a technique that includes generating a checkpoint for an application that is executing on a plurality of nodes of a distributed computing system. Forming the checkpoint typically includes selectively regulating communication of data from the plurality of nodes to a storage subsystem based at least in part on a replication of the data among the nodes.

The disclosure provides area-efficient logic circuitry for checkpointing a register file using a mapper in an in-order CPU (central processing unit). An embodiment includes a pair of flops with a shared master stage latch circuit for implementing storage elements in a register file and a checkpointed copy of the same register file. By sharing the master stage, significant area saving is achieved relative to a native design that has two complete master-slave flops.

In-order CPUs can be implemented using Moray® checkpointing. This technique could be suitable for fast interrupts where the state is captured in a second set of registers rather than being written to memory.

Processing circuitry may perform processing of instructions from a given program according to either "in-order"

processing or "out-of-order" processing. In an in-order processor, the instructions of the program are executed in the same order in which they are defined in the program, so that if an older instruction in the program is stalled, for example because it is waiting for operands to become available, then it is not possible to execute a younger instruction even if the younger instruction does have its operands available. On the other hand, in an out-of-order processor, if an older instruction in the program order is stalled but a younger instruction can execute because all of its operands are available and it is independent of the stalled instruction, then the processor may execute the younger instruction first to avoid wasting cycles when the processor cannot execute the next instruction, and hence improve performance overall.

An apparatus has in-order processing circuitry to perform in-order processing of instructions and a number of physical registers for storing data for access by the in-order processing circuitry in response to architectural register specifiers specified by the instructions. The number of physical registers is greater than the number of architectural register specifiers in a set of architectural register specifiers that are specifiable by the instructions. A mapping storage element stores current register mapping information identifying, for each architectural register specifier in a subset of the set of architectural register specifiers, which physical register stores valid data corresponding to that architectural register specifier. At least one checkpoint storage element is provided to store checkpoint register mapping information corresponding to a checkpoint of previous architectural state. The checkpoint register mapping information identifies, for each architectural register specifier in the subset, which of the physical registers stores the previous architectural state corresponding to that architectural register specifier according to the checkpoint.

Providing such register mapping information, which enables the particular physical register mapped to a given architectural register to be varied would be unconventional for an in-order processor. While register renaming may be used in out-of-order processors to remove false address hazards caused by the limited number of architectural register specifiers available and so enables younger instructions to execute ahead of older instructions once the hazard has been removed by remapping the registers, in an in-order processor it is not possible to reorder the execution of younger instructions relative to older instructions and so such register renaming functionality would be seen as having no benefit.

However, providing a mapping storage element for mapping each architectural register specifier onto one of a larger set of physical registers and providing at least one checkpoint storage element to store checkpoint register mapping information corresponding to the register mappings captured at an earlier moment in time corresponding to a checkpoint of previous architectural state, this can be beneficial for an in-order processing circuitry to enable previous checkpoints of architectural states to be captured in a more efficient way.

Checkpoints can be captured simply by transferring mapping information between the mapping storage element and the checkpoint storage element, without needing the corresponding register state data itself to be transferred. This can be very useful for supporting functionality such as transactional memory, branch prediction or load speculation which may require previous checkpoints of architectural state to be retained in case speculative processing turns out to be incorrect and the state needs to be rewound to a previous moment of execution.

Control circuitry can control the capture and the restoration of checkpoints based on the checkpoint storage elements. The control circuitry may be responsive to a checkpoint capture event to set the checkpoint register mapping information of a selected storage element to correspond to the current register mapping stored in the mapping storage element.

Hence, when a checkpoint needs to be taken, the control circuitry may select one of the at least one checkpoint storage element and copy the current register mapping information specified by the mapping storage element into the selected checkpoint storage element. This allows a checkpoint to be taken without needing to actually transfer any register data other than the mapping information.

Typically, the mapping information may have a smaller data volume than the register state itself, so this may greatly reduce performance overhead by enabling the checkpoint to be taken much faster as there is less data to copy.

The checkpoint capture event may be any event, which requires the current register state to be retained in case it needs to be restored at a later point. A checkpoint capture event may comprise the execution of a transaction start instruction that represents a start of a transaction comprising one or more instructions executed between the transaction start instruction and a transaction end instruction, for which effects of any instructions within the transaction are to be committed when the transaction end instruction is reached in the absence of an abort event occurring between the transaction start and end instructions.

Transactional memory is a technique for resolving conflicts between different threads of processing sharing access to a common resource and it may require the current register state to be captured at the start of the transaction in case an abort occurs during the transaction causing the state to be rewound to the state that was present at the start of the transaction. By using the technique discussed above, the checkpointing at the start of a transaction can be performed faster as it only requires mapping information identifying which physical registers correspond to each architectural register to be transferred, not the register state itself to be transferred.

In summary, by controlling which register the result of the instruction is written to following taking of a checkpoint, depending on whether the current register mapping matches the checkpoint register mapping, this can enable the checkpoint to be safely retained within the register file, so that this supports the ability to save and restore checkpointed register states by transferring register mapping information between the mapping storage element and the checkpoint register mapping storage elements as discussed above.

Normally, in an in-order processor supporting transactional memory, one would expect that to capture the checkpoint of the current register state in response to the transaction start instruction TSTART, it would be necessary to copy all of the architectural state data from the physical register file to another storage location, such as a second set of registers or a memory system, and then on restoring a checkpoint they would need to be copied back. However, the number of architectural registers available in the instruction set architecture may be large and so this copying of states data may take a long time.

FIG. 1 illustrates a mapped register file for fast checkpointing 100. By using the mapping storage element 146, the check point storage element 148, and a physical register file 122 which includes a greater number of physical registers than the number of architectural registers specifiers that are specifiable by instructions according to the supported instruction set architecture, this can enable saving and restoration of checkpoints to be performed more quickly to improve performance.

FIG. 1 shows an example where the number of physical registers is N×P, where P is the number of architectural registers that are specifiable in the architecture and in this example N=2. For conciseness FIG. 1 only shows an example using the general purpose registers 122, but the vector registers can be duplicated in a similar way in physical registers provided in hardware. Each architectural register specifier (e.g. R0, R1, R2, etc.) can be mapped to one of two alternative physical registers by the register access control circuitry 144.

Current register mapping information in the mapping storage element 146 (also known as data location register or DLR) identifies which of the pair of alternate physical registers stores the valid data value for a given architectural register specifier. For example, in the case shown in FIG. 1 general purpose registers R0, R2 and R5 are valid in register group 0 while general purpose registers R1, R3 and R4 are valid in register group 1, as indicated by the corresponding mapping bit in the DLR 146. Multiplexers 144 provided as the register access control circuitry can select which physical register a register read or register write acts upon, based on the bit in the DLR 146.

When a checkpoint is to be taken, then the register access control circuitry simply copies the current values from the DLR 146 into the checkpoint storage element 148 so that the checkpoint mapping information becomes the same as the current register mapping information. Therefore, whatever values were in the physical registers indicated as valid in the DLR become the checkpoint state.

Thus, the mapping scheme shown in FIG. 1 describes how a continuously-updated Data Location Register ("DLR"), which may be a mapping storage element that stores current register mapping information identifying for each architectural register specifier of a subset of the architectural register specifier. The DLR register 146 tracks the location of valid data during a transaction, which may include a Moray® transaction. A second Checkpoint register ("ChkPt") 148 takes a copy of the DLR register 146 at the beginning of the transaction so that if the transaction fails to complete, ChkPt register 148 is copied back to DLR register 146 to restore the pointers to the original register file contents. The two register files (146, 148) can be implemented using cut-down single-master/dual-slave flops.

An embodiment of this disclosure is directed to checkpointing that involves taking, or obtaining, or accessing a copy of a value before speculatively updating that value while retaining the option of "rewinding", or looking backward, to the original value. Two slave, or child, latches, also referred to as second latches, herein, correspond to the DLR and ChkPt registers. The master, or parent latch, also referred to as a first latch herein, is shared by the two registers (DLR, ChkPt). Thus, the two registers (DLR, ChkPt) share the same input stage.

Figure 2:
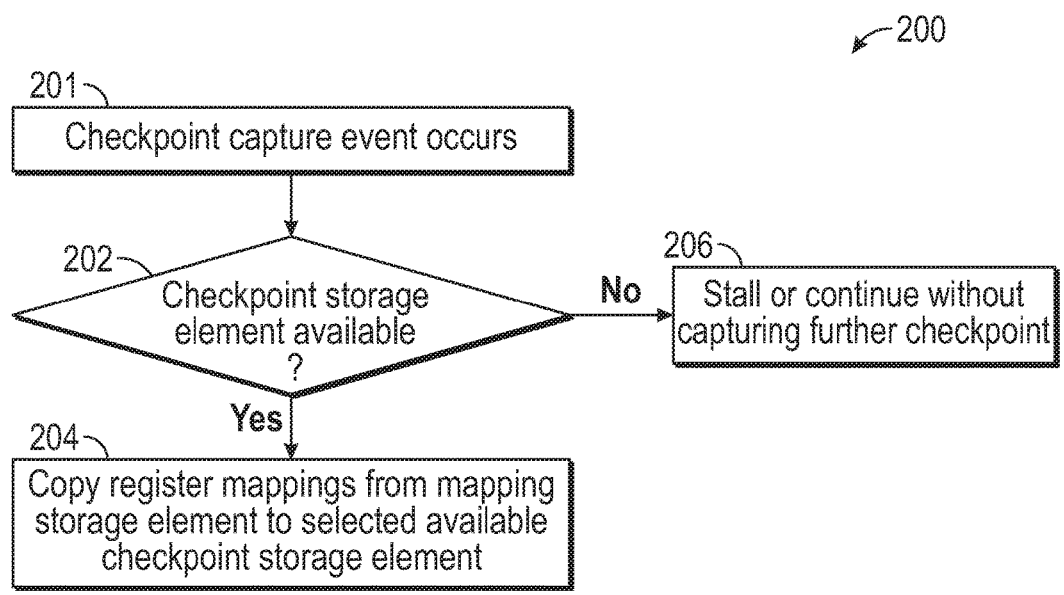
FIG. 2 illustrates a flow diagram that shows a method for capturing a checkpoint.

FIG. 2 illustrates a flow diagram 200 showing a method of capturing a checkpoint. A checkpoint capture event is detected (201) by the register access (as shown in FIG. 1 as control circuitry 144, or by other circuitry associated with the pipeline, which signals to the register access control circuitry that a checkpoint needs to be taken). For example, the checkpoint capture event could be the execution of a transaction start instruction, or the making of a branch prediction. Register access control circuitry (shown in FIG. 1 as 144) determines whether there is a checkpoint storage element available for storing a checkpoint.

If so, then the register mapping data is copied (204) from the mapping storage element (shown in FIG. 1 as element 146) to an available checkpoint storage element (shown in FIG. 1 as element 148).

If there is no checkpoint storage element available, then either processing can be stalled or processing may continue without capturing a further checkpoint (206) (in this case if state needs to be restored then a previous checkpoint can be used and processing may have to rewind to a point earlier than the point at which the current checkpoint capture event occurred).

FIG. 3 shows a CMOS (complementary metal-oxide semiconductor) circuit 300. The circuit 300 is a circuit that is configured to retain or retime an input signal in the form of a logical value.

Circuit 300 shows that an input D (Data) 302, is provided to selective gating circuit 308, which also receives clk (clock) signal 304 and ˆclk (inverted clock) signal 306. The gate circuit 308 may be considered a transmission gate circuit that both transmits and/or blocks a signal. While gate circuit 308 may be a transmission gate circuit, the gate function includes transmitting a signal as well as not transmitting a signal, hence the term gate. A latch circuit 309 includes inverter circuit 310 that is in parallel with inverter circuit 312. Inverter circuit 312 receives clk (clock) signal 314 and ˆclk (inverted clock) signal 316. Latch circuit 309 outputs a signal to inverter circuit 318, which produces an output signal Q' 320.

FIG. 4 shows a CMOS positive-edge triggered flip-flop 400. An input signal D (Data) 402 is provided to circuit 408, which also receives clk (clock) signal 404 and ˆclk (inverted clock) signal 406. Circuit 408 may be a transmission gate circuit and may be considered a transmission gate circuit that both transmits and/or blocks a signal. While gate circuit 408 may be a transmission gate circuit, the gate function includes transmitting a signal as well as not transmitting a signal, hence the term gate. The output of circuit 408 is provided to master latch circuit, or first latch circuit, 407.

Master latch circuit 407 is comprised of inverter circuits 410 and 412. Circuit 412 also receives clk (clock) signal 415. The output from master latch circuit 407 (comprised of inverter circuits 410 and 412) is provided to inverter circuit 418, which outputs Q' signal 420.

Q' signal 420 is provided to circuit 426, which may be a transmission gate, as described herein with reference to elements 308 and 408, which also receives clk (clock) signal 422 and ˆclk (inverted clock) signal 424. The output from circuit 426 is provided to slave latch circuit 435 (slave latch circuit 435 is comprised of inverter circuit 428 and inverter circuit 430). Inverter circuit 430 also receives ˆclk (inverted clock) signal 432. The output from slave latch circuit 435 is provided to inverter circuit 434, which outputs Q output signal 440.

An output signal 438 is produced from the output of latch circuit 435. The output of latch circuit 435 is provided to inverter circuit 436, which generates ˆQ output signal 438.

Figure 5:
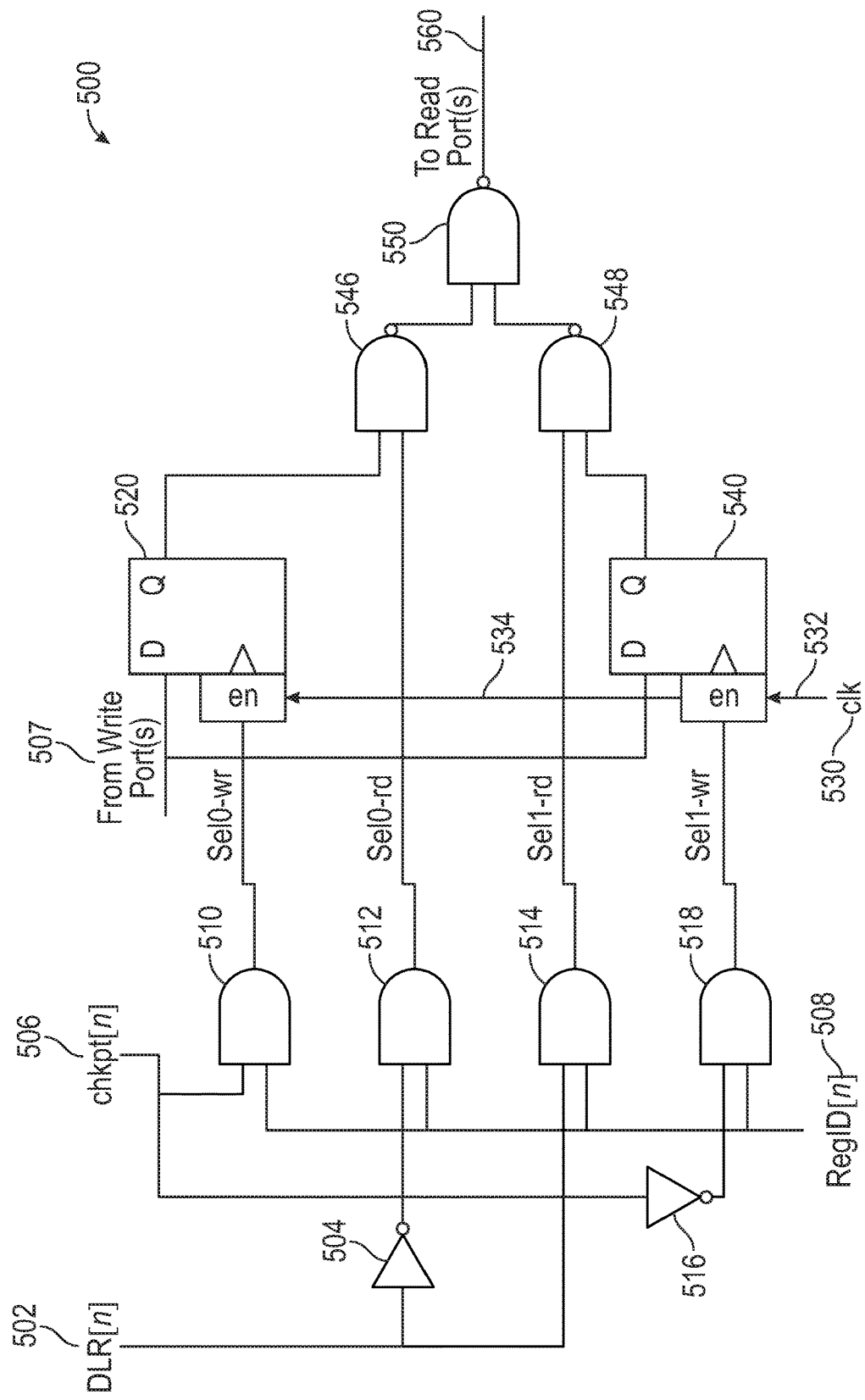
FIG. 5 shows a logic diagram of a checkpointable pair of flops.

FIG. 5 shows a logic diagram 500 of a checkpointable pair of flops. As shown in FIG. 5, two positive edge-triggered circuits 520 and 540 receive a combined clock signal and individual data signals sel0-wr and sel1-wr, respectively. These signals are first and second control signal components, respectively.

As stated herein, there are any suitable number of second (slave) latch circuits (the two slave latch circuits are shown as 520, 540). Each of the "n"-number (where "n" is any suitable number) of second latch circuits is operatively coupled to the first (master) latch circuit, each of the n-number of second (slave) latch circuits is operable to receive a component of the control signal, sel-wr, as input.

Pairs of master-slave flops are emulated with a shared data input, from write ports, but with different clock enables (sel0-wr and sel1-wr), and with two read enables (sel0-rd and sel1-rd), to select the valid read data. The two D-type flops are copies of the same architectural register bit. Consequently, sel0-rd/wr and sel1-rd/wr are both derived from the same 5→32 decode of the 5-bit register ID. In fast Moray® checkpointing, n versions sel0-rd/wr and sel1-rd/wr are derived from two n-bit registers, DLR (shown in FIG. 1 as element 146) and chkpt (shown in FIG. 1 as element 148), that sit to the side of the register file being checkpointed: DLR specifies which of each pair of registers to read valid data from and chkpt specifies the location of the checkpointed data.

Indeed, FIG. 5 shows input signals: DLR[n] 502; checkpoint (chkpt[n]) 506; signals from write port(s) 507; regID [n] 508; and clock signal 530.

DLR[n] input 502 is provided to inverter circuit 504. The inverter circuit 504 provides an inverted DLR signal to AND gate 512, which also receives input from regID[n] 508 to produce read enable signal sel0-rd, which is provided as an input signal to NAND gate 546.

DLR[n] input 502 is provided to AND gate 514, which also receives regID[n] 508. AND gate 514 outputs read enable signal sel1-rd to NAND gate 548.

AND gate 510 receives chkpt[n] 506 and regID[n] 508 to output clock enable signal sel0-wr to slave latch circuit 520.

Checkpoint signal (chkpt[n]) 506 is provided to inverter circuit 516, which inverts the checkpoint signal 506 and provides input to AND gate 518, which also receives regID [n] 508. AND gate 518 outputs clock enable signal sel1-wr to slave latch circuit 540.

Slave latch circuit 520 receives an input signal from write port(s) 507, clock enable signal sel0-wr from AND gate 510 and clock signal 534, which may be thought of logically as a single signal, are derived from clock signal 530. Slave latch circuit 520 outputs Q to NAND gate 546. The signal sel0-wr is a control signal input to slave latch circuit 520. The signal sel0-wr is a control signal component derived from sel-wr.

Slave latch circuit 540 receives an input signal from write port(s) 507, clock enable signal sel1-wr from AND gate 518 and clock signal 532, derived from clock signal 530. Slave latch circuit 540 outputs Q to NAND gate 548. The signal sel1-wr is a control signal input to slave latch circuit 540. The signal sel1-wr is a control signal component derived from sel-wr.

NAND gate 548 (which receives read enable signal sel1-rd that is output from AND gate 514 and Q output from slave latch circuit 540) and NAND gate 546 (which receives read enable signal sel0-rd that is output from AND gate 512 and Q output from slave latch circuit 520) output signals to NAND gate 550, which outputs a signal 560 to one or more read ports.

FIG. 5 shows that the checkpointable register file is updated as follows: if DLR[n] chkpt[n], write to the register pointed at by ~DLR and invert the DLR bit; if DLR[n]< >chkpt[n], write to the register pointed at by DLR only (do not invert the DLR bit). Thus, if DLR[n] chkpt[n], the DLR is pointing to the checkpointed data and any new data should be written to the other register; if DLR[n]< >chkpt[n], the DLR is pointing to non-checkpointed data and any new data should be written to that register, thus preserving the checkpointed data.

This gives the following equations for updating the pair of registers:

sel0-wr[$n$]=(regID[4:0]==5'$b$[$n$]) and ((DLR[$n$]=1 and chkpt[$n$]=1)|(DLR[$n$]=0 and chkpt[$n$]=1))

→sel0-wr[$n$]=(regID[4:0]==5'$b$[$n$]) and (chkpt[$n$]1)

sel1-wr[$n$]=(regID[4:0]==5'$b$[$n$]) and ((DLR[$n$]=0 and chkpt[$n$]=0)|(DLR[$n$]=1 and chkpt[$n$]=0))

→sel1-wr[$n$]=(regID[4:0]==5'$b$[$n$]) and (chkpt[$n$]=0)

Conversely, data is always read from the register being pointed at by the DLR:

sel0-rd[$n$]=(regID[4:0]==5'$b$[$n$]) and DLR[$n$]=0 sel1-rd[$n$]=(regID[4:0]==5'$b$[$n$]) and DLR[$n$]=1

This logic is illustrated for one pair of flops in FIG. 5. Clock enable signals sel0-wr and sel1-wr have a fan-out of one clken cell each, whereas read enable signals sel0-rd and sel1-rd have a fan-out of 32 NAND2 gates assuming there are 32 bits in the registers.

Figure 6:
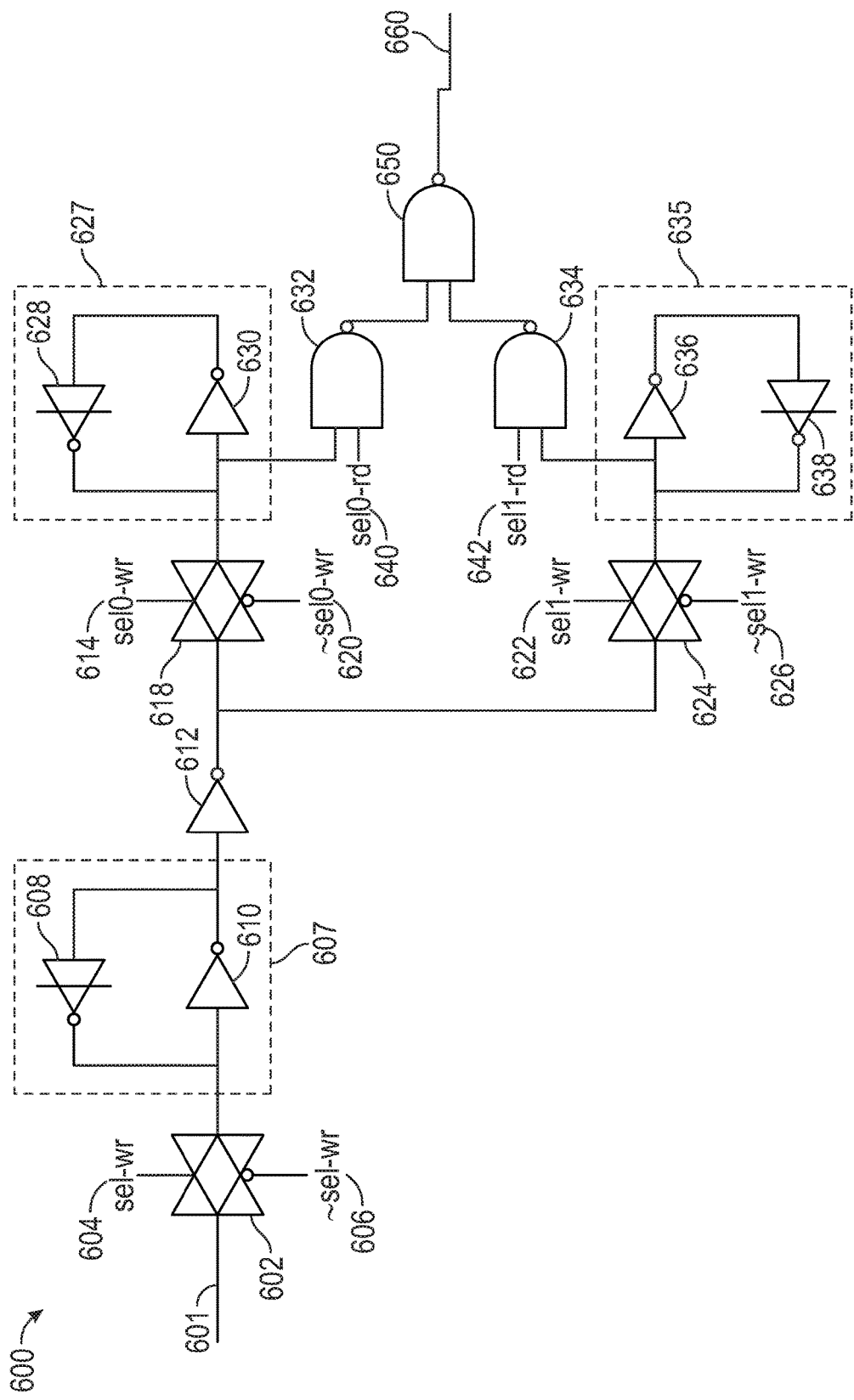
FIG. 6 shows a single-master/dual-slave flop circuit.

FIG. 6 shows a single-master dual-slave flop 600 for fast checkpointing. As shown in FIG. 6, the slave latch circuits 627 and 635 receive different clock signals (sel0-wr[n] and sel1-wr[n], respectively) both received clock enable signals are derived from a clock enable signal sel-wr[n] by being AND'd with chkpt[n] and its complement. The different clock signals, sel0-wr and sel1-wr, are control input signals to the slave latch circuits 627, 635. The sel0-wr control signal is one component derived from sel-wr and the sel1-wr control signal is another component derived from sel-wr.

The master stages of each pair of flops can be merged using a combined clken signal:

sel-wr[$n$]={(regID[4:0]==5'$b$[$n$]) and chkpt[$n$]}|{(regID[4:0]==5'$b$[$n$]) and ~chkpt[$n$]}

=(regID[4:0]=5'$b$[$n$])

In fact, this is the same clken signal 530 as for a non-checkpointable register file. Then, the two slave latch circuits 520, 540 receive clock enable signals sel0-wr[n] and sel1-wr[n], respectively, both derived from sel-wr[n] by being AND'd with chkpt[n] and its complement.

As shown in FIG. 6, gate circuit 602 receives an input, such as a data input as well as clock enable signal sel-wr 604 and its complement ^sel-wr 606. A master latch circuit 607, which includes inverter circuits 608 and 610, receives the output from circuit 602. The master latch circuit 607 provides a signal to inverter circuit 612. Inverter circuit 612 provides input to gate circuit 618 and gate circuit 624.

Circuit 618 receives clock enable signal sel0-wr 614 and its complement ^sel0-wr 620. Circuit 624 receives clock enable signal sel1-wr 622 and its complement ^sel1-wr 626. Clock enable signal sel0-wr 614 and clock enable signal sel1-wr 622 are both derived from clock enable signal sel-wr[n] being AND'd with chkpt[n] and its complement ^chkpt[n].

A first slave latch circuit 627 is formed by inverter circuits 628 and 630. Inverter circuit 630 receives data from master latch from circuit 618.

A second slave latch circuit 635 is formed by inverter circuits 636 and 638. Inverter circuit 636 receives the data from mater latch clock from circuit 624.

NAND gate 632 receives output from the first slave latch circuit 627 and read enable signal sel0-rd 640. NAND gate 634 receives output from the second slave latch circuit 635 and read enable signal sel1-rd 642.

The output from NAND gate 632 and the output of NAND gate 634 are received by NAND gate 650, which outputs signal 660, which may be provided to read port(s).

Any combination of one or more computer-usable or computer-readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device.

The computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if desired, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer-usable program code may be transmitted using any appropriate medium, including but not limited to wireless, wire line, optical fiber cable, RF, etc.

Computer program code for carrying out operations may be written in any combination of one or more programming languages, including an object-oriented programming language such as Java, Smalltalk, C++, C# or the like, and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present embodiments are described below with reference to flowchart illustrations and/or block diagrams of methods, apparatus, systems and computer program products according to embodiments. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer, or other programmable data processing apparatus, create means for implementing the functions/acts specified in the flowchart and/or block diagram block or blocks. These computer program instructions may also be stored in a computer-readable medium that can direct a computer or other programmable data processing apparatus, to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer, or other programmable apparatus to produce a computer-implemented process such that the instructions which execute on the computer or other programmable apparatus, provide processes for implementing the functions/acts specified in the flowchart and/or block diagram block or blocks.

Unless stated otherwise, terms such as "first" and "second" are used to arbitrarily distinguish between the elements such terms describe. Thus, these terms are not necessarily intended to indicate temporal or other prioritization of such elements.

As will be appreciated by one skilled in the art, the disclosure may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the embodiments may take the form of a computer program product embodied in any tangible medium of expression having computer-usable program code embodied in the medium.

It can be seen that the apparatus, system and methodologies presented herein provide an advancement in the state of the art.

Accordingly, some of the disclosed embodiments are set out in the following:

An apparatus comprising: a first latch circuit that is operable to receive an input signal and output a data signal; two or more second latch circuits, each operatively coupled to the first latch circuit, a first one of the second latch circuits operable to receive a first component of a control signal, as input, and a second one of the second latch circuits operable to receive a second component of the control signal, as input; a first register operable to track data during a transaction; and a second register operatively coupled to the two or more of the second latch circuits, the second register interacting with the first register based on an operational state of the first register.

The apparatus in item 1, where the first one of the second latch circuits receives, as input, a first signal as the first component of the control signal.

The apparatus in item 2, where the second one of the second latch circuits receives, as input, a second signal as the second component of the control signal.

The apparatus in item 3, where a first signal is SEL0-WR and the second signal is SEL1-WR.

The apparatus in item 1, where the first component of the control signal and the second component of the control signal are generated as a function of a single input signal being logically combined with a signal from the second register.

The apparatus in item 1, where the interacting comprises capturing the state of the first register by the second register.

The apparatus in item 1, where the interacting comprises storing the state of the first register by the second register.

The apparatus in item 1, where the interacting comprises copying the state of the first register by the second register.

The apparatus in item 1, further comprising n-number of second latch circuits, each of the n-number of second latch circuits operatively coupled to the first latch circuit, each of the n-number of second latch circuits operable to receive a component of the control signal, as input.

The apparatus in item 1, where the data signal output from the first latch is provided to the two or more second latch circuits, as input.

A method comprising: generating a first control signal based on a control signal and a clock enable signal; generating a second control signal based on the control signal and the clock enable signal; providing the first control signal, as input, to a first latch circuit; providing the second control signal, as input, to a second latch circuit; tracking a location of valid data in contents of a first register during a transaction; and copying the contents of the first register at the beginning of the transaction to a second register based on an operational state of the first register.

The method in item 11, further comprising generating the first control signal and the second control signal as a function of a single input signal being logically combined with a signal from the second register.

The method in item 11, where the copying comprises capturing the state of the first register by the second register.

The method in item 11, where the copying comprises storing the state of the first register by the second register.

The method in item 11, where the first control signal is SEL0-WR and the second control signal is SEL1-WR, SEL0-WR and SEL1-WR being derived from SEL-WR.

A system comprising: a plurality of physical registers adapted to store data; a first register adapted to interact with each of the physical registers; a second register operatively coupled to the first register to provide a checkpoint for the first register; a flop circuit comprising: a first latch circuit that is operable to receive an input signal and output a data signal; two or more second latch circuits operatively coupled to the first latch circuit, a first one of the second latch circuits operable to receive a first component of a control signal, as input, and a second one of the second latch circuits operable to receive a second component of the control signal, as input.

The system in item 16, where the first component of the control signal and the second component of the control signal are a function of a single input signal being logically combined with a signal from the second register.

The system in item 16, where the first one of the second latch circuits receives, as input, a first signal as the first component of the control signal.

The system in item 16, where the second one of the second latch circuits receives, as input, a second signal as the second component of the control signal.

The system in item 19, where a first signal is SEL0-WR and the second signal is SEL1-WR.

The system in item 16, where the second register provides a checkpoint for the first register by capturing the state of the first register by the second register.

The system in item 16, where the second register provides a checkpoint for the first register by storing the state of the first register by the second register.

The system in item 16, further comprising n-number of second latch circuits, each of the n-number of second latch circuits operatively coupled to the first latch circuit, each of the n-number of second latch circuits operable to receive a component of the control signal, as input.

The system in item 16, where the data signal output from the first latch circuit is provided to the two or more second latch circuits, as input.

The various representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

The invention claimed is:

1. An apparatus comprising:
a first latch circuit operable to receive an input signal and output a data signal;
two or more second latch circuits, each operatively coupled to the first latch circuit, a first one of the second latch circuits operable to receive a first component of a control signal, as input, and a second one of the second latch circuits operable to receive a second component of the control signal, as input;
a first register operable to track data during a transaction; and
a second register, operatively coupled to the two or more second latch circuits, operable to interact with the first register based on an operational state of the first register.

2. The apparatus as claimed in claim 1, where the first one of the second latch circuits is operable to receive, as input, a first signal as the first component of the control signal.

3. The apparatus as claimed in claim 2, where the second one of the second latch circuits is operable to receive, as input, a second signal as the second component of the control signal.

4. The apparatus as claimed in claim 3, where a first signal is SEL0-WR and the second signal is SEL1-WR.

5. The apparatus as claimed in claim 1, where the first component of the control signal and the second component of the control signal are generated as a function of a single input signal that is logically combined with a signal from the second register.

6. The apparatus as claimed in claim 1, where the second register is operable to capture the state of the first register.

7. The apparatus as claimed in claim 1, where the second register is operable to store the state of the first register.

8. The apparatus as claimed in claim 1, where the second register is operable to copy the state of the first register.

9. The apparatus as claimed in claim 1, where the two or more second latch circuits include n-number of second latch circuits, each of the n-number of second latch circuits is operatively coupled to the first latch circuit, and each of the n-number of second latch circuits is operable to receive a component of the control signal, as input.

10. The apparatus as claimed in claim 1, where the data signal output from the first latch is provided to the two or more second latch circuits, as input.

11. A method comprising:
generating a first control signal based on a control signal and a clock enable signal;
generating a second control signal based on the control signal and the clock enable signal;
providing the first control signal, as input, to a first latch circuit;
providing the second control signal, as input, to a second latch circuit;
tracking a location of valid data in contents of a first register during a transaction; and copying the contents of the first register at the beginning of the transaction to a second register based on an operational state of the first register.

12. The method as claimed in claim 11, further comprising generating the first control signal and the second control signal as a function of a single input signal being logically combined with a signal from the second register.

13. The method as claimed in claim 11, where the copying comprises capturing the state of the first register by the second register.

14. The method as claimed in claim 11, where the copying comprises storing the state of the first register by the second register.

15. The method as claimed in claim 11, where the first control signal is SEL0-WR, the second control signal is SEL1-WR, and SEL0-WR and SEL1-WR are derived from SEL-WR.

16. A system comprising:
  a plurality of physical registers operable to store data;
  a first register operable to interact with each of the physical registers;
  a second register, operatively coupled to the first register, operable to provide a checkpoint for the first register; and
  a flop circuit comprising:
    a first latch circuit operable to receive an input signal and output a data signal; and
    two or more second latch circuits operatively coupled to the first latch circuit, a first one of the second latch circuits operable to receive a first component of a control signal, as input, and a second one of the second latch circuits operable to receive a second component of the control signal, as input.

17. The system as claimed in claim 16, where the first component of the control signal and the second component of the control signal are a function of a single input signal that is logically combined with a signal from the second register.

18. The system as claimed in claim 16, where the first one of the second latch circuits is operable to receive, as input, a first signal as the first component of the control signal.

19. The system as claimed in claim 16, where the second one of the second latch circuits is operable to receive, as input, a second signal as the second component of the control signal.

20. The system as claimed in claim 19, where a first signal is SEL0-WR and the second signal is SEL1-WR.

21. The system as claimed in claim 16, where the second register is operable to provide a checkpoint for the first register by capturing the state of the first register.

22. The system as claimed in claim 16, where the second register is operable to provide a checkpoint for the first register by storing the state of the first register.

23. The system as claimed in claim 16, where the two or more second latch circuits include n-number of second latch circuits, each of the n-number of second latch circuits is operatively coupled to the first latch circuit, and each of the n-number of second latch circuits is operable to receive a component of the control signal, as input.

24. The system as claimed in claim 16, where the data signal output from the first latch circuit is provided to the two or more second latch circuits, as input.

* * * * *